United States Patent [19]
Terao

[11] Patent Number: 5,191,535
[45] Date of Patent: Mar. 2, 1993

[54] MASK CONTROL SYSTEM

[75] Inventor: Haruo Terao, Kitakyushu, Japan

[73] Assignee: Kabushiki Kaisha Toshiba, Kawasaki, Japan

[21] Appl. No.: 621,813

[22] Filed: Dec. 4, 1990

[30] Foreign Application Priority Data

Dec. 5, 1989 [JP] Japan .................................. 1-314191

[51] Int. Cl.$^5$ ...................... G06F 15/46; G05B 13/02
[52] U.S. Cl. ..................................... 364/468; 156/627
[58] Field of Search ............... 364/468, 469, 141, 490, 364/491, 140; 29/430; 156/626, 627; 430/30; 427/74

[56] References Cited

U.S. PATENT DOCUMENTS

| | | | |
|---|---|---|---|
| 4,571,685 | 2/1986 | Kamoshida | 364/468 |
| 4,700,311 | 10/1987 | Tributsch et al. | 364/468 |
| 4,901,242 | 2/1990 | Kotan | 364/468 |

Primary Examiner—Jerry Smith
Assistant Examiner—Paul Gordon
Attorney, Agent, or Firm—Finnegan, Henderson, Farabow, Garrett and Dunner

[57] ABSTRACT

A mask control system for a semiconductor production photo engraving process (PEP step), comprising a controller including lot selecting means for selecting a lot from wafer lots to be withdrawn from a step preceding the PEP step, and wafer lots to be processing by the PEP step, and mask searching means for searching a mask corresponding to the lot selected by the lot selecting means; and a output unit for causing the controller to detect locations of mask corresponding to selected lots, and for designating a washing order for the mask detected by the controller when the masks are in a washing step. With the preferred embodiment of the invention, selection of a wafer lot and search of a mask are automatically performed, and washing of masks is carried out according to priority, thereby shortening the time required for the PEP.

14 Claims, 2 Drawing Sheets

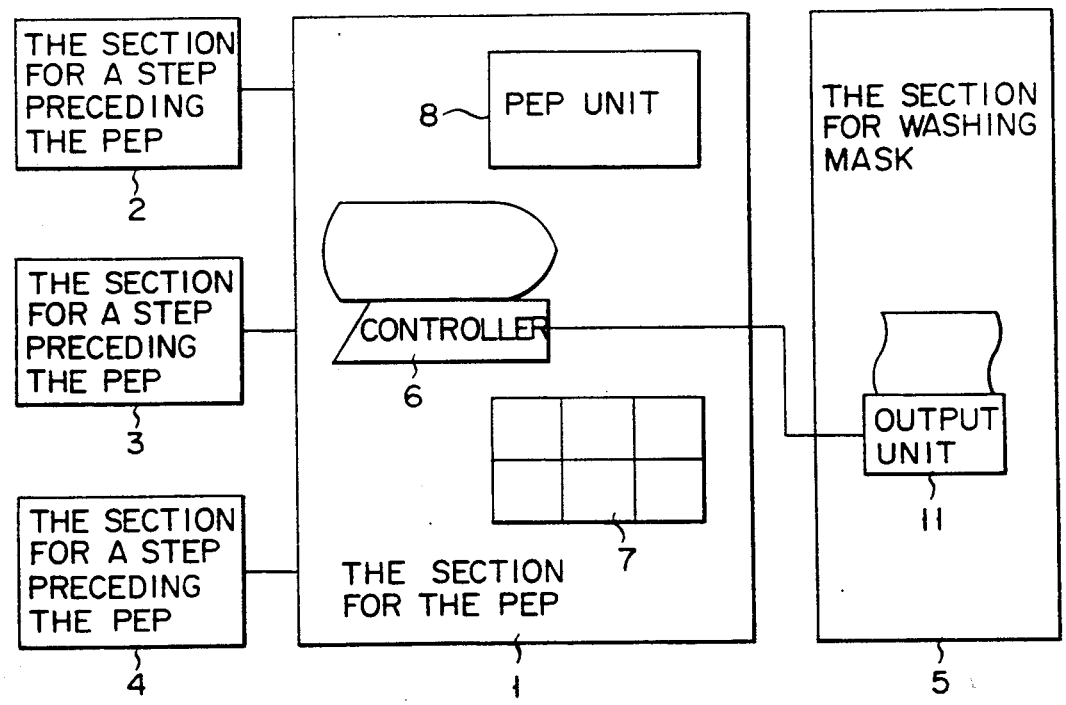
F I G. 1
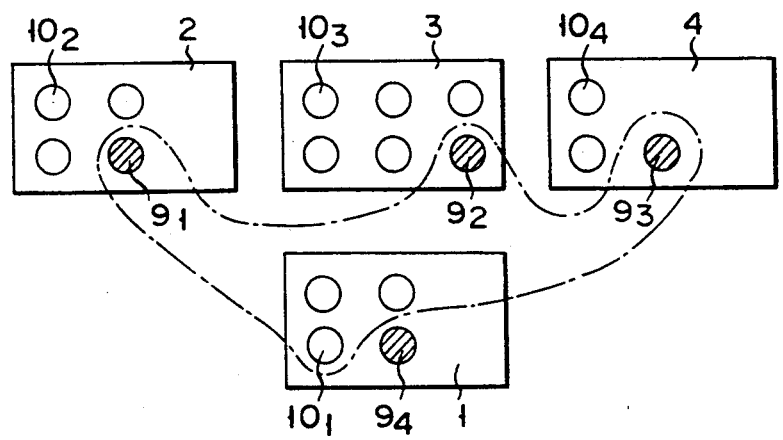
F I G. 2

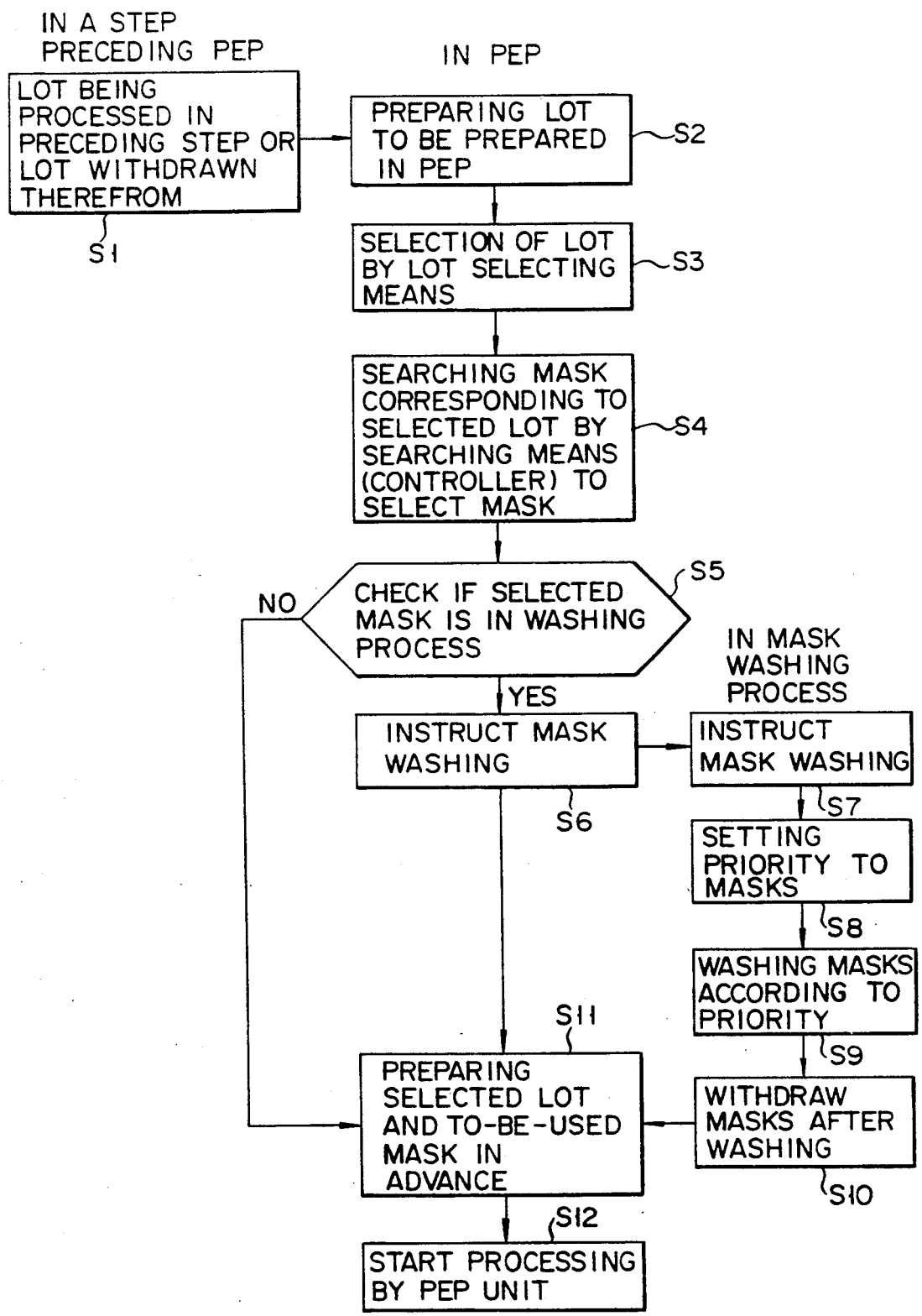
F I G. 3

MASK CONTROL SYSTEM

BACKGROUND OF THE INVENTION

1. Field of the Invention

The present invention relates to a mask controlling system for use in the photo engraving process (PEP) for manufacturing semiconductor devices.

2. Description of the Related Art

Conventionally, masks used for processing a lot of wafers standing by to be processed in the PEP is manually searched out. With this conventional technique, however, it takes time to search for the masks required for a wafer lot to be processed next. Further, usually, masks are washed for reuse, and washing thereof should be carried out in accordance with the priority. If these masks are washed regardless of the priority, a great deal of time will be wasted while a mask required is set standing by.

SUMMARY OF THE INVENTION

The purpose of the present invention is to shorten the time for searching out a mask by automatically designating the location of the mask. Moreover, when the mask is in the washing step, washing of the required mask is instructed by the output unit in order to immediately prepare the mask used for a to-be-processed wafer lot, thereby shortening the time needed from withdrawal of the lot from the previous step, to that from the PEP step.

To achieve the above-mentioned purpose, the present invention has provided a mask control system used in the photo engraving process (the PEP step) of a semiconductor production, comprising a controller including lot selecting means for selecting a wafer lot from wafer lots to-be-withdrawn from the step preceding the PEP step, and to-be-processed wafer lots in the PEP step, and a searching means for a mask corresponding to the lot selected by said selecting means, and an output unit which makes said controller search out the location of said selected lot, and designates, when the masks searched out by said controller are in a washing step, the order of washing to each mask therein.

In the present invention, selection of a lot and searching out masks are automatically carried out by the controller and the output unit, and when the masks are in the washing step, they are washed according to priority. Then, the mask of priority is set ready to be processed, and the above washed mask and the selected lot are also set ready in combination before withdrawal of the wafer lot which have been processed in PEP from the unit. Thus, the time required from the withdrawal of a to-be-processed lot from the preceding step to completion of the PEP can be shortened.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 shows a structure of the mask control system according to the present invention;

FIG. 2 illustrates selection of wafer lots in the PEP step with the same structure; and FIG. 3 is a flow-chart of operation of the PEP.

DETAILED DESCRIPTION OF THE PREFERRED EMBODIMENTS

An embodiment of the present invention will be described with reference to the drawings. FIG. 1 is a view of a system structure of the embodiment illustrating a section 1 (or room) for the PEP step, sections 2–4 for steps preceding to the PEP, and a section 5 for washing masks. In the section 1, which is for the PEP, there are controller (computer) 6, mask maintenance shelf 7, and a PEP unit 8. The controller 6 has a lot selecting means that controls data of wafer lots $9_1$–$9_3$ being processed in the sections 2–4 and to-be-processed lot $10_1$ in the PEP, as well as data of the locations of all the masks, and selects lots to be processed in the PEP from the objective wafer lots (in this case, lot $9_1$–$9_3$ and $10_1$). Further, this controller has a mask searching means for searching out the mask corresponding to the to-be-processed lot in the PEP from the mask maintenance section mentioned later. The washing section 5 is provided with an output unit 11. When there is a required mask in the section 5, the output unit 11 instruct to wash the required mask, setting the top priority thereto, and the controller 6 returns the masks which have been washed, according to priority to the maintenance shelf 7.

In FIG. 2, numeral $9_4$ denotes a lot being processed in the PEP, and numerals $10_2$–$10_4$ are wafer lots which have not yet processed in these steps preceding the PEP.

In the system thus structured, the mask maintenance section used for the PEP in the section 1 is divided into the mask control unit 7, the PEP unit 8, and the section 5 for the washing step. With reference to FIG. 1, in the steps preceding the PEP, which is called the step s1 in the flow-chart of FIG. 3, lots $9_1$–$9_3$ being processed in the preceding steps 2–4 or lot $10_1$ which has been pushed out after completion of a preceding step are set stand by as the lots for the next operation in the step s2 of the PEP. Then, the operator searches a wafer lot (lot to be processed next) which is to be processed in the unit 8 by means of the controller 6. In this step, wafer lots $9_1$–$9_3$ being processed in the sections 2, 3, and 4 for the preceding steps in FIG. 2, and to-be-processed lot $10_1$ at the section 1 are objected, and this searching of the lot is carried out a certain time before completion of the process by the PEP unit. This selection of a lot is performed in the step s3 of FIG. 3. In the step s4, the mask which corresponds to the lot thus selected is searched by the mask searching means of the controller 6, which is called mask selection. In the step s5, it is judged whether this selected mask is in the washing process, the location of the mask corresponding to the selected lot, i.e. the maintenance shelf 7, process unit 8, or the washing machine 5, is informed to the operator. When the mask corresponding to the selection lot is in the section 5 of the washing process, the controller 6 instruct to carry out washing of the mask in step s6. In the step s7, an instruction output for washing a mask is emitted to the output unit 11 of the washing section 5, and mask washing is performed according to priority in accordance with the necessity of the PEP in the steps s8 and s9. In the case other than that proceeding from the step s6 to s7 (which takes place when a desired mask is in the washing step), the selected mask for the next operation is withdrawn from, for example the maintenance shelf 7, and the selected lot for the next operation and the mask to be used are set stand-by in the step s11.

Meanwhile, when washing of the mask is completed in the step 10, the mask is pushed out to the PEP section. After operating the step's11, the next PEP step by the PEP unit is started.

As described, according to the preferred embodiment of the present invention, before completion of the process by the PEP unit, a to-be-processed lot and the mask which is used therefore can be prepared. Thus, standing-by time period of the PEP unit 8 can be shortened, and therefore the time needed from withdrawal of the lot from the previous step, to that of the PEP step can be shortened.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A mask control system for a semiconductor production photo engraving process (PEP step) comprising:
    a controller including lot selecting means for selecting a wafer lot from wafer lots to-be-withdrawn from a step preceding the PEP step, and wafer lots to-be-processed in the PEP step, and a searching means for searching a mask corresponding to the wafer lot selected by said selecting means; and
    an output unit for causing said controller to detect locations of masks corresponding to selected lots, and for designating a washing order for said masks detected by said controller when said masks are in a washing step.

2. A mask control system according to claim 1, further including a PEP unit for performing the PEP step, wherein said controller and said output unit comprise a function for setting a mask for a next lot on standby before completion of a process of the PEP unit.

3. A mask control system according to claim 1, further including a PEP unit for performing the PEP step, wherein said controller and said output unit comprise a function for setting said selected lot and said searched mask on standby before withdrawal of a lot from the PEP unit.

4. A mask control system for a semiconductor production process having a first step of wafer processing, a second step of wafer processing, subsequent to the first step, and a third step of mask preparation, the system comprising:
    a controller including:
        selected means for selecting a wafer lot from among wafers being processed by the first step and wafers that have been processed by the first step, and
        searching means for searching a mask corresponding to the selected wafer lot, and
    means for directing the controller to detect a location of a mask corresponding to the selected lot; and
    means, responsive to the location detected by the controller, for designating a processing order for masks to be processed by the third step.

5. A mask control system according to claim 4, wherein the controller and the designating means comprise a function for setting the selected lot and the searched mask on standby during execution of the second step.

6. A mask control system according to claim 4, wherein the controller and the designating means comprise a function for setting a mask for a next lot on standby during execution of the second step.

7. A method comprising the steps, executed by a semiconductor production system, of:
    a first step of processing a wafer;
    a second step of processing a wafer, subsequent to the first step;
    a step of preparing a mask;
    selecting a wafer lot from among wafers being processed by the first step and wafers that have been processed by the first step;
    searching a mask corresponding to the selected wafer lot;
    detecting a location of a mask corresponding to the selected lot wafer; and
    designating, responsive to the detecting step, a processing order for masks to be processed by the third step.

8. A method according to claim 7, further including the step, performed during an execution of the second step, of
    setting a mask for a next lot on standby.

9. A method according to claim 8, wherein the second step includes the substep of performing a photo engraving process.

10. A method according to claim 7, further including the step, performed during an execution of the second step, of
    setting the selected lot and the searched mask on standby.

11. A method according to claim 10, wherein the second step includes the substep of performing a photo engraving process.

12. A method according to claim 7, wherein the third step includes the substep of washing a mask.

13. A method according to claim 7, wherein the second step includes the substep of performing a photo engraving process, and
    wherein the third step includes the substep of washing a mask.

14. A method according to claim 7, wherein the second step includes the substep of performing a photo engraving process.

* * * * *